(12) United States Patent
Andryushchenko

(10) Patent No.: US 6,790,336 B2
(45) Date of Patent: Sep. 14, 2004

(54) METHOD OF FABRICATING DAMASCENE STRUCTURES IN MECHANICALLY WEAK INTERLAYER DIELECTRICS

(75) Inventor: Tatyana Andryushchenko, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 273 days.

(21) Appl. No.: 10/175,671

(22) Filed: Jun. 19, 2002

(65) Prior Publication Data

US 2003/0234182 A1 Dec. 25, 2003

(51) Int. Cl.[7] .............................................. C25D 5/48
(52) U.S. Cl. .................. 205/220; 205/223; 205/261; 205/291; 205/640; 205/674; 205/917; 438/689
(58) Field of Search ................................. 205/220, 223, 205/261, 291, 640, 674, 917; 438/689

(56) References Cited

U.S. PATENT DOCUMENTS 5,096,550 A    3/1992  Mayer et al.
6,017,437 A    1/2000  Ting et al.
6,143,155 A   11/2000  Adams et al.
6,328,872 B1  12/2001  Talieh et al.

OTHER PUBLICATIONS

Grill, A., "From tribological coatings to low-k dielectrics for ULSI interconnects," Thin Solid Films 398–399 (2001), pp. 527–532. (no month given).

Lin, Simon, et al., "Low-k Dielectrics Characterization for Damascene Integration," Conference Proceedings, IITC, Jun. 2001, pp. 146–148.

Waeterloos, J.J., et al.,"Integration feasibility of Porous SiLK Semiconductor Dielectric," Conference Proceedings, IITC, Jun. 2001, pp. 253–254.

*Primary Examiner*—Robert R. Koehler
(74) *Attorney, Agent, or Firm*—Blakely, Sokoloff, Taylor & Zafman LLP

(57) ABSTRACT

A copper damascene process for a mechanically weak low k dielectric layer is described. Electropolishing is used to etch back the copper. A sacrificial conductive layer beneath the barrier layer assures complete planarization of the copper.

20 Claims, 2 Drawing Sheets

METHOD OF FABRICATING DAMASCENE STRUCTURES IN MECHANICALLY WEAK INTERLAYER DIELECTRICS

BACKGROUND OF THE INVENTION

1. Field of the Invention

The invention relates to the field of interlayer connections in semiconductor devices using a copper damascene structure.

2. Prior Art

In current integrated circuits, several layers of interconnect structures fabricated above a substrate containing active devices are often used. Each interconnect layer is fabricated in, or on, an interlayer dielectric (ILD). Vias are formed in each ILD to make contact with conductors in underlying layers. It is generally accepted that the dielectric material in each ILD should have a low dielectric constant (k) to obtain low capacitance between the conductors.

Copper damascene structures are often used in conjunction with the ILDs to provide the interconnect structure. Typically, the copper is planarized using chemical-mechanical polishing (CMP) because of the difficulties of chemically etching copper.

A problem arises where low k dielectrics are used in conjunction with a copper damascene structure. The low k dielectrics are inherently mechanically weak, and consequently, not particularly suitable for the stresses associated with the CMP.

Articles discussing low k dielectrics are: "From tribological coatings to low-k dielectrics for ULSI interconnects," by A. Grill, Thin Solid Films 398–399 (2001) pages 527–532; "Integration Feasibility of Porous SiLK Semiconductor Dielectric," by J. J. Waeterloos, et al., IEEE Conference Proceedings, IITC, (June 2001) pages 253–254; and "Low-k Dielectrics Characterization for Damascene Integration," by Simon Lin, et al., IEEE Conference Proceedings, IITC, (June 2001) pages 146–148.

DETAILED DESCRIPTION

A method for forming a damascene structure on a low k dielectric is described. In the following description, numerous specific details are set forth, such as specific materials and thicknesses in order to provide a thorough understanding of the present invention. It will be apparent to one skilled in the art that the present invention may be practiced without these specific details. In other instances, well known processing steps, such as masking and etching steps, have not been described in detail in order not to unnecessarily obscure the present invention.

Figure 1:
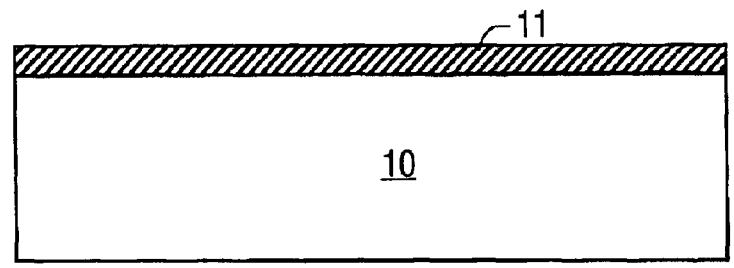
FIG. 1 is a cross-sectional elevation view of an interlayer dielectric (ILD) with a sacrificial metal layer formed thereon.

Referring first to FIG. 1, an ILD 10 is illustrated, which may be any one of a plurality of known dielectric layers. Conductors are formed in the layer 10 which provide conductive paths with vias extending to conductors lying below the layer 10 and vias lying above the layer 10. For purposes of the description below, only the formation of a conductor is described within the layer 10 using a damascene process. It will be apparent that contacts to underlying structures are formed simultaneously with the formation of the conductors, as is well-known in the art. The processing described below is used to simultaneously form not only the conductors in the layer 10, but also the vias which contact structures below the layer 10.

The layer 10 may be formed from any one of a plurality of known dielectric materials. In one embodiment of the present invention, layer 10 is formed from a low k dielectric such as a polymer based dielectric. In another embodiment an inorganic material such as a carbon-doped oxide is used.

One category of low k materials, the organic polymers, are typically spun-on. A discussion of perfluorocyclobutane (PFCB) organic polymers is found in "Integration of Perfluorocyclobutane (PFCB)", by C. B. Case, C. J. Case, A. Komblit, M. E. Mills, D. Castillo, R. Liu, Conference Proceedings, ULSI XII.COPYRGT. 1997, Materials Research Society, beginning at page 449. These polymers are available from companies such as Dupont, Allied Signal, Dow Chemical, Dow Corning, and others.

Another category of low k materials that may be used in the present invention are silica-based such as the nanoporous silica aerogel and xerogel. These dielectrics are discussed in "Nanoporous Silica for Dielectric Constant Less than 2", by Ramos, Roderick, Maskara and Smith, Conference Proceedings ULSI XII.COPYRGT. 1997, Materials Research Society, beginning at page 455 and "Porous Xerogel Films as Ultra-Low Permittivity Dielectrics for ULSI Interconnect Applications", by Jin, List, Lee, Lee, Luttmer and Havermann, Conference Proceedings ULSI XII.COPYRGT. 1997, Materials Research Society, beginning at page 463.

A conductive layer 11 is formed on the ILD 10. This layer is sometimes referred to in this application as a sacrificial layer since as will be seen, it serves as a conductive layer for processing purposes, and does not appear in the final structure. A metal layer having relatively high conductivity is used for layer 11, since as will be seen, it is needed for the electropolishing. In one embodiment, layer 11 is a tungsten layer or tungsten alloy layer. The layer may have a thickness of, for example, 100–2,000 Å.

Figure 2:
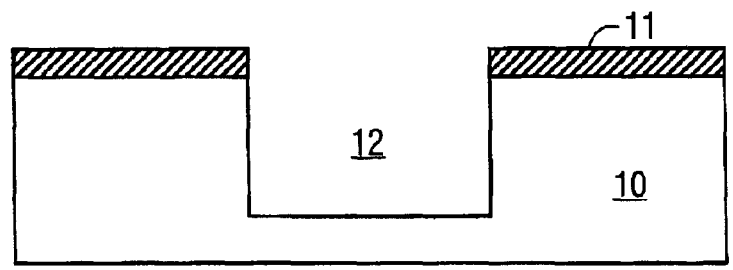
FIG. 2 illustrates the structure of FIG. 1 after a trench has been etched in the ILD.

As shown in FIG. 2, a trench such as trench 12 is etched into the layer 10 through the sacrificial layer 11. Ordinary masking and etching processing is used to form the trench 12 and other trenches and via openings needed within the layer 10.

Figure 3:
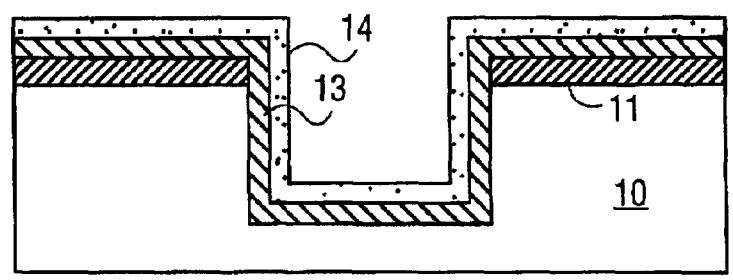
FIG. 3 illustrates the structure of FIG. 2 after the formation of a barrier layer and a seed layer.

As shown in FIG. 3, a blanket barrier layer 13 is formed on the dielectric, which covers not only the sacrificial layer 11, but also lines the trench formed in the layer 10. The barrier layer 13 is used to prevent copper from diffusing into the dielectric material, as is well-known. For this purpose, 200 Å of tantalum or tantalum nitride may be used, as shown by the layer 13 of FIG. 3.

Now, a copper or copper alloyed seed layer 14 is deposited to carry the electrical current for the electroplating of the copper. The copper alloy seed layer 14 may be formed using numerous conventional processes such as chemical vapor deposition (CVD), sputtering, etc. to uniformly deposit a relatively thin layer 14. This layer may be formed from nickel, gold, or other materials. Layer 14 improves the electro-migration resistance of the entire interconnect structure.

Figure 4:
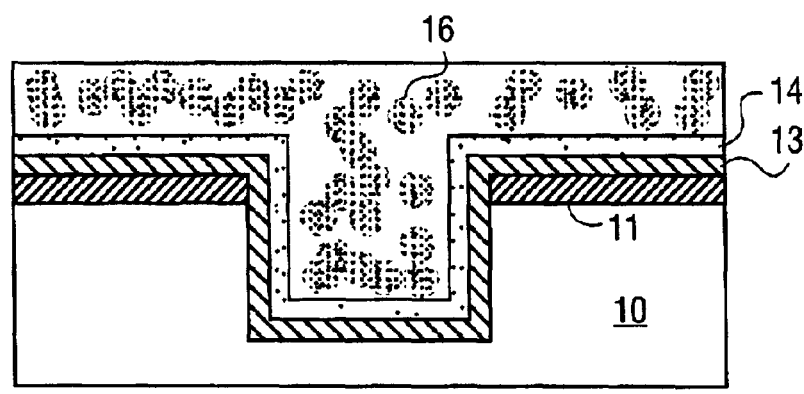
FIG. 4 illustrates the structure of FIG. 3 after the formation of a copper layer.

Next, an ordinary plating process is used to form the copper or copper alloy layer 16 shown in FIG. 4.

In typical prior art processing, CMP is now used to planarize the structure of FIG. 4, removing the copper 16, copper seed layer and barrier layer, from the upper surface of the dielectric. However, as mentioned earlier, because of the mechanical weakness of the low k dielectric layer 10, CMP is not an ideal way to planarize the structure of FIG. 4.

Electropolishing is also known to planarize layers such as a copper layer. Electropolishing and related technology is described in U.S. Pat. Nos. 5,096,550; 6,017,437; 6,143,155; and 6,328,872. This type of process may be looked at as being the reverse of electroplating, and as such requires conduction through the layer 16. One problem in using electropolishing is that islands of copper form which become disconnected and electrically isolated. Thus, in using electropolishing on the layer 16, several islands of copper may remain on the dielectric 10. The barrier layer 13, such as a tantalum or titanium layer, does not provide sufficient conduction to prevent the formation of the copper islands.

Figure 5:
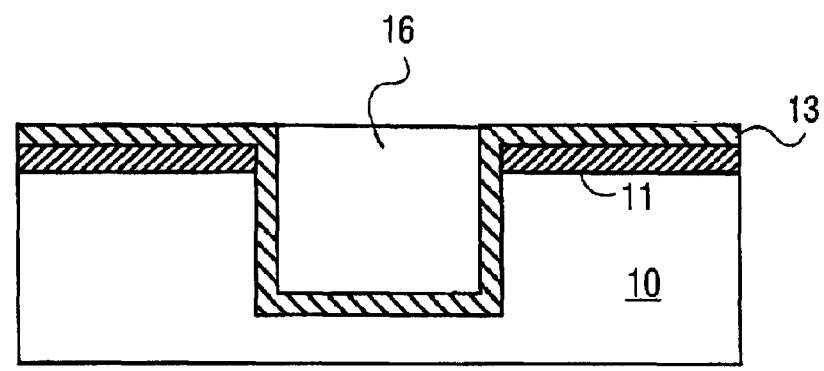
FIG. 5 illustrates the structure of FIG. 4 after electropolishing.

With the present invention, however, the sacrificial layer 11 provides additional conduction which allows the electropolishing to be more effective, and consequently, allows the layer 16 to be planarized. The resultant structure is shown in FIG. 5.

Figure 6:
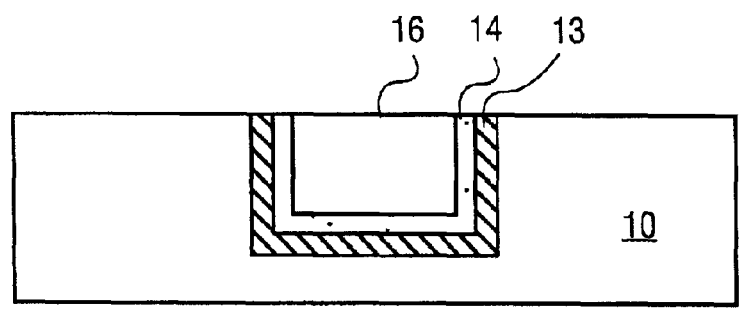
FIG. 6 illustrates the structure of FIG. 5 after the removal of several layers.

Now as shown in FIG. 6, the barrier layer 13 where exposed, is removed using well-known selective chemical etchants. Then, additional chemical etching are used to remove the sacrificial conductive layer 11. An etchant that does not attack either the dielectric 10 or the copper 16 is used for removal of the layer 11.

The sacrificial layer 11 protects the low k dielectric when the barrier layer 13 is etched. It is known that the barrier materials such as tantalum and titanium can be chemically etched in HF-based solutions. These solutions, however, also attack the low k dielectric. Since the sacrificial layer 11 remains intact at the time that the barrier layer is etched, it protects the low k dielectric. Finally, the sacrificial layer is etched selectively, for instance, in an $H_2O_2$ based solution without damaging the low k dielectric.

Thus, as shown above, the role of the sacrificial layer 11 is to carry electrical current across the wafer, particularly during the final copper removal from the field regions during electropolishing. The added conductivity of the sacrificial layer ensures an efficient electrical path to the copper islands that often form towards the end of the electropolishing. The sacrificial layer 11 provides higher conductivity when compared to the traditional barrier materials of tantalum or titanium, thus assuring sufficient electrical current across the wafer during the electropolishing.

What is claimed is:

1. A damascene process comprising:

depositing a dielectric;

forming a sacrificial metal layer on the dielectric;

forming an opening through the sacrificial metal layer into the dielectric;

forming a barrier layer over the sacrificial metal layer and in the opening to line the opening;

forming copper over the barrier layer;

electropolishing the copper layer;

removing the barrier layer; and removing the sacrificial metal layer with a chemical etchant that discriminates between the dielectric and the sacrificial metal layer.

2. The process defined by claim 1, wherein the dielectric is a low k dielectric.

3. The process defined by claim 2, wherein the low k dielectric is a non-organic layer.

4. The process defined by claim 2, wherein the low k dielectric is a polymer layer.

5. The process defined by claim 1, wherein the sacrificial metal is tungsten.

6. The process defined by claim 5, wherein the barrier layer is tantalum.

7. The process defined by claim 6, wherein the barrier layer is tantalum nitride.

8. The process defined by claim 1, including forming a seed layer before forming the copper layer.

9. The process defined by claim 8, wherein the copper is formed by electroplating.

10. In the fabrication of a damascene interconnect layer, the improvement comprising:

forming a sacrificial metal layer on the surface of a dielectric prior to etching trenches in the dielectric;

forming trenches in the dielectric;

forming a barrier metal over the sacrificial metal layer so as to line the trenches with the barrier metal;

forming copper over the barrier metal layer; and electropolishing the copper layer.

11. The improvement of claim 10, wherein the sacrificial metal layer is removed following the electropolishing.

12. The improvement of claim 11, wherein the sacrificial metal layer is tungsten.

13. The improvement of claim 12, wherein the tungsten layer is removed with the etchant containing $H_2O_2$.

14. The improvement of claim 13, wherein the dielectric is a low k dielectric.

15. The improvement of claim 11, wherein the sacrificial metal layer is removed with an etchant that discriminates between the sacrificial meal layer and the dielectric.

16. An interlayer dielectric forming process comprising:

depositing a dielectric layer;

forming a conductive layer on the dielectric layer;

forming trenches in the dielectric layer through the conductive layer;

forming barrier and copper layers over the conductive layer and in the trenches; and electropolishing the copper layer so as to form a damascene structure.

17. The process defined by claim 16, wherein the dielectric layer is a low k layer.

18. The process defined by claim 16, wherein the conductive layer is removed from the dielectric layer.

19. The process defined by claim 18, wherein the conductive layer is tungsten.

20. The process defined by claim 19, wherein the tungsten is removed with the etchant containing $H_2O_2$.

* * * * *

UNITED STATES PATENT AND TRADEMARK OFFICE
CERTIFICATE OF CORRECTION

PATENT NO. : 6,790,336 B2
DATED : September 14, 2004
INVENTOR(S) : Andryushchenko It is certified that error appears in the above-identified patent and that said Letters Patent is hereby corrected as shown below:

Column 2,
Line 22, delete "Komblit" and insert -- Kornblit --.

Signed and Sealed this

Fourteenth Day of June, 2005

JON W. DUDAS
*Director of the United States Patent and Trademark Office*